(12) United States Patent
Pan et al.

(10) Patent No.: US 9,001,513 B2
(45) Date of Patent: Apr. 7, 2015

(54) SEMICONDUCTOR SWITCH INSULATION PROTECTION DEVICE AND POWER SUPPLY ASSEMBLY

(75) Inventors: Lifeng Pan, Shanghai (CN); Hongming Li, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 148 days.

(21) Appl. No.: 13/584,995

(22) Filed: Aug. 14, 2012

(65) Prior Publication Data

US 2013/0258603 A1 Oct. 3, 2013

(30) Foreign Application Priority Data

Mar. 30, 2012 (CN) .......................... 2012 1 0090899

(51) Int. Cl.
*H05K 7/20* (2006.01)
*H01L 23/40* (2006.01)
*H01L 23/473* (2006.01)

(52) U.S. Cl.
CPC ..... *H01L 23/4006* (2013.01); *H01L 2023/4087* (2013.01); *H01L 2924/0002* (2013.01)

(58) Field of Classification Search
CPC ....... G06F 1/16; G06F 1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ...................... 361/679.46–679.54, 688–723; 257/712–722, E23.088; 165/80.2–80.3, 165/185; 174/15.1–15.3, 16.1–16.3
See application file for complete search history.

(56) References Cited

U.S. PATENT DOCUMENTS 4,827,329 A * 5/1989 Schach et al. .................. 257/796
5,305,185 A * 4/1994 Samarov et al. ............... 361/704

(Continued)

*Primary Examiner* — Michail V Datskovskiy
*Assistant Examiner* — Razmeen Gafur
(74) *Attorney, Agent, or Firm* — Tim TingKang Xia, Esq.; Morris, Manning & Martin, LLP

(57) ABSTRACT

A semiconductor switch insulation protection device and a power supply assembly. Said semiconductor switch protection device comprises a semiconductor switch having a metal component, an insulation component, and a pin installed at a bottom plane of said insulation component, and an insulation protection cover having a body with a second hole and a side belt. A front surface of said metal component is installed on a back surface of said insulation component. A metal portion, with a first hole and having a first height, is extended above an upper plane of said insulation component. Said second hole and said side belt are extended toward a back surface of said body, respectively, to form a hole column having a second height and a sidewall having a third height. Said metal portion is disposed in a groove formed by said back surface of said body, hole column and sidewall.

17 Claims, 4 Drawing Sheets

(56) References Cited

U.S. PATENT DOCUMENTS

| | | | |
|---|---|---|---|
| 5,450,284 A * | 9/1995 | Wekell | 361/710 |
| 5,640,304 A * | 6/1997 | Hellinga et al. | 361/707 |
| 6,088,226 A * | 7/2000 | Rearick | 361/704 |
| 6,404,065 B1 * | 6/2002 | Choi | 257/782 |
| 6,587,344 B1 * | 7/2003 | Ross | 361/704 |
| 7,021,365 B2 * | 4/2006 | Rearick et al. | 165/80.3 |
| 7,151,671 B2 * | 12/2006 | Hyodo | 361/717 |
| 7,359,201 B2 * | 4/2008 | Nakajima | 361/704 |
| 7,715,196 B2 * | 5/2010 | Chen et al. | 361/719 |
| 7,817,426 B2 * | 10/2010 | Tamori | 361/704 |
| 8,363,409 B2 * | 1/2013 | Chung | 361/713 |
| 2002/0141161 A1 * | 10/2002 | Matsukura et al. | 361/713 |
| 2003/0006471 A1 * | 1/2003 | Satoh et al. | 257/471 |
| 2004/0066610 A1 * | 4/2004 | Miyachi et al. | 361/679 |
| 2006/0232942 A1 * | 10/2006 | Nakatsu et al. | 361/710 |
| 2007/0085197 A1 * | 4/2007 | Arai et al. | 257/712 |
| 2007/0086165 A1 * | 4/2007 | Nakajima | 361/704 |
| 2007/0165376 A1 * | 7/2007 | Bones et al. | 361/688 |

* cited by examiner

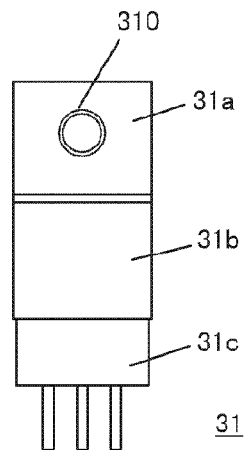
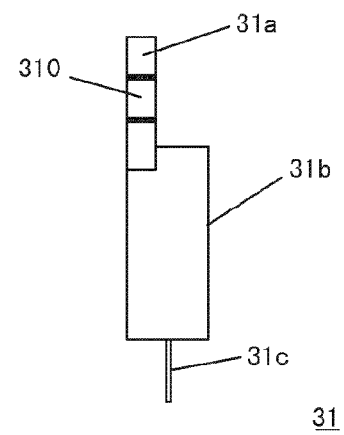
Fig 6A
Fig 6B
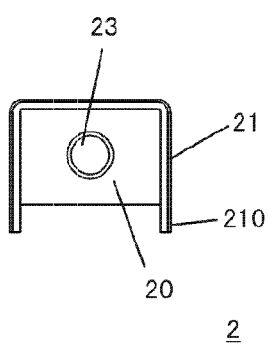
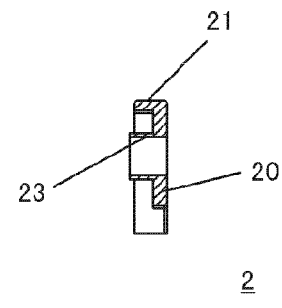
Fig 6C
Fig 6D
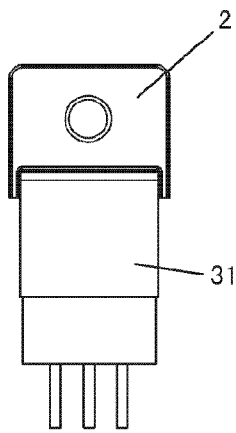
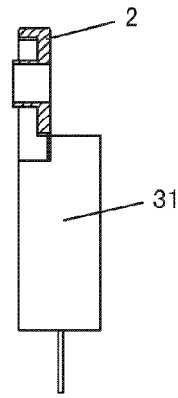
Fig 6E
Fig 6F

SEMICONDUCTOR SWITCH INSULATION PROTECTION DEVICE AND POWER SUPPLY ASSEMBLY

CROSS-REFERENCE TO RELATED APPLICATION

This non-provisional application claims priority under 35 U.S.C. §119(a) on Patent Application No. 201210090899.1 filed in P.R. China on Mar. 30, 2012, the entire contents of which are hereby incorporated by reference.

TECHNICAL FIELD

The disclosure relates to an insulation protection for semiconductor switch, particularly, it aims to an insulation protection device of semiconductor switch (transistor) during the assembly process for a power supply assembly.

BACKGROUND ART

The prior art during the assembly process for a power supply assembly is shown as FIG. 1 and FIG. 2, a plastic insulation pad 11, a semiconductor switch 12, a thermal conduction insulation sheet 13 and a heat sink 14 are secured together by using a screw 10. In the prior art, the insulation of a single semiconductor switch is realized mainly by using a single plastic insulation pad in order to prevent the short circuit caused by the conducting between the semiconductor switch and the heat sink.

The disadvantage of this is that the function, that the dust, metal wire and metal powder, and the like, are prevented from existing outside the metal portion of the semiconductor switch, can not be realized. If the metal wire and metal powder are attached on the metal portion of the semiconductor switch, a short circuit will be produced between the semiconductor switch and the heat sink or between the semiconductor switch and the semiconductor switch.

CONTENTS OF THE INVENTION

The object of the disclosure is to solve the above problems and to provide a semiconductor switch insulation protection device in order to implement the insulation protection for the non-insulated package of the semiconductor switch.

Another object of the disclosure is to provide a power supply assembly, and the insulation protection for the non-insulated package of the semiconductor switch in the power supply assembly can be realized by using the semiconductor switch insulation protection device.

The technical scheme of the disclosure is: a semiconductor switch insulation protection device is disclosed in the disclosure, said device comprises a semiconductor switch, said semiconductor switch comprises a metal component, an insulation component, and a pin, the front surface of said metal component is installed on the back surface of said insulation component, and a metal portion having a first height is extended above the upper plane of said insulation component, said metal portion comprises a first hole, said pin is installed at the bottom plane of said insulation component, wherein it further comprises an insulation protection cover, said insulation protection cover comprises a body, said body comprises a second hole and a side belt, said second hole is extended toward the back surface of said body to form a hole column having a second height, said side belt is extended toward the back surface of said body to form a sidewall having a third height, a groove is formed by the back surface of said body, said hole column and said sidewall, and the metal portion having the first height is disposed in said groove.

According to an embodiment of the semiconductor switch insulation protection device of the disclosure, said insulation protection cover is installed on the front surface of said metal component to allow that said metal portion having the first height is shielded entirely by said insulation protection cover.

According to an embodiment of the semiconductor switch insulation protection device of the disclosure, the third height of said sidewall equals to the thickness of said metal component.

According to an embodiment of the semiconductor switch insulation protection device of the disclosure, the second height of said hole column is larger than the thickness of said metal component.

According to an embodiment of the semiconductor switch insulation protection device of the disclosure, said sidewall is extended toward the direction of said pin for a first length.

According to an embodiment of the semiconductor switch insulation protection device of the disclosure, said first length is smaller than the distance between the upper plane and bottom plane of said insulation component.

According to an embodiment of the semiconductor switch insulation protection device of the disclosure, said sidewall and said hole column are both perpendicular to said body.

According to an embodiment of the semiconductor switch insulation protection device of the disclosure, a material of said insulation protection cover is a high temperature insulation material.

According to an embodiment of the semiconductor switch insulation protection device of the disclosure, the body, the hole column, and the sidewall of said insulation protection cover are formed integrally.

According to an embodiment of the semiconductor switch insulation protection device of the disclosure, said insulation protection cover and said semiconductor switch are secured on a non-insulation object by a fastener.

A power supply assembly is further disclosed in the disclosure, said assembly comprises a heat sink device, a semiconductor switch, said semiconductor switch comprises a metal component, an insulation component, and a pin, the front surface of said metal component is installed on the back surface of said insulation component, and it is extended above the upper plane of said insulation component to form a metal portion having a first height, said metal portion comprises a first hole, said pin is installed on the bottom plane of said insulation component, wherein it further comprises an insulation protection cover, said insulation protection cover comprises a body, said body comprises a second hole and a side belt, said second hole is extended toward the back surface of said body to form a hole column having a second height, said side belt is extended toward the back surface of said body to form a sidewall having a third height, a groove is formed by the back surface of said body, said hole column and said sidewall, and the metal portion having the first height is disposed in said groove, said insulation protection cover and said semiconductor switch are installed on said heat sink device by a fastener.

According to an embodiment of the power supply assembly of the disclosure, said insulation protection cover is installed on the front surface of said metal component to allow that said metal portion having the first height is shielded entirely by said insulation protection cover.

According to an embodiment of the power supply assembly of the disclosure, the back surface of said metal component is disposed to face said heat sink device.

According to an embodiment of the power supply assembly of the disclosure, the third height of said sidewall equals to the thickness of said metal component.

According to an embodiment of the power supply assembly of the disclosure, the second height of said hole column is larger than the thickness of said metal component.

According to an embodiment of the power supply assembly of the disclosure, said sidewall is extended toward the direction of the pin for a first length.

According to an embodiment of the power supply assembly of the disclosure, said first length is smaller than the distance between the upper plane and the bottom plane of said insulation component.

According to an embodiment of the power supply assembly of the disclosure, said sidewall and said hole column are both perpendicular to said body.

According to an embodiment of the power supply assembly of the disclosure, a material of said insulation protection cover is a high temperature insulation material.

By comparing the disclosure with the prior art, the benefits are as follows: in the semiconductor switch insulation protection device of the disclosure, the semiconductor switch comprises a metal component, an insulation component and a pin, the front surface of the metal component is installed on the back surface of the insulation component, and a metal portion having a first height is extended above the upper plane of said insulation component, the metal portion comprises a first hole, a pin installed on the bottom plane of the insulation component, and it further comprises a insulation protection cover comprising a body, said body comprises a second hole and a side belt, the second hole is extended toward the back surface of said body to form a hole column having a second height, said side belt is extended toward the back surface of said body to form a sidewall having a third height, a groove is formed by the back surface of said body, said hole column and said sidewall, and said metal portion having the first height is disposed in the groove. By comparing with the prior art, the semiconductor switch insulation protection device of the disclosure is light and thin, it can be installed easily, and the function of insulation and dust-proof can be obtained. All of the metal components of the semiconductor switch can be insulated, and the metal wire and metal powder can be prevented from attaching thereon thereby the short circuit problems between the semiconductor switch and the heat sink as well as between the semiconductor switches with each other can be solved.

DESCRIPTION OF FIGURES

FIG. 6A~FIG. 6F illustrate installation schematic diagrams of an insulation protection cover and a semiconductor switch in the semiconductor switch insulation protection device of the disclosure.

MODE OF CARRYING OUT THE INVENTION

The disclosure will be further described by incorporating the drawings and the embodiments.

Figure 1:
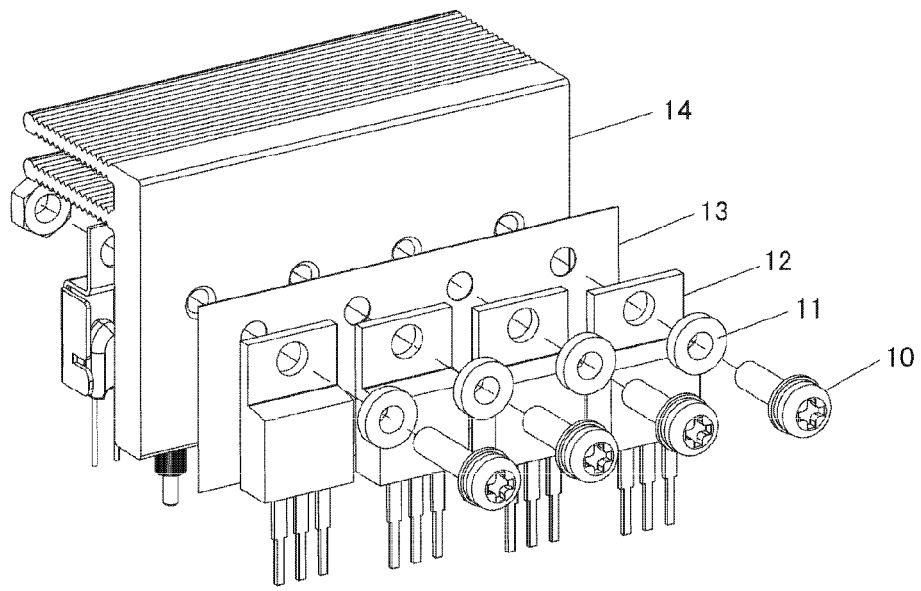
FIG. 1 and FIG. 2 illustrate assembling schematic diagrams of the semiconductor switch being installed traditionally on the heat sink.
Figure 2:
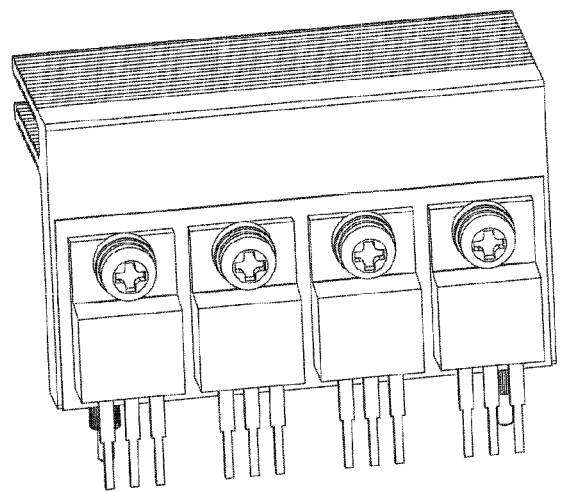
Figure 3A:
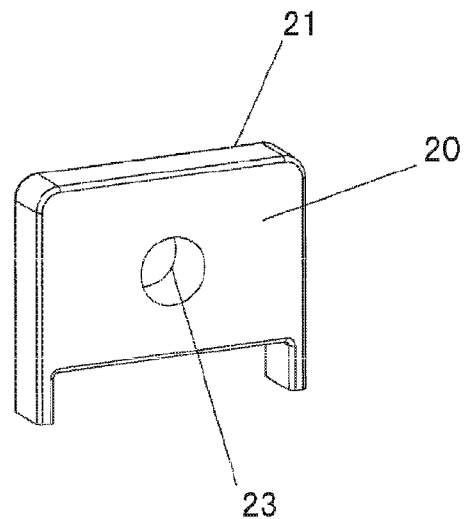
FIG. 3A and FIG. 3B illustrate structure diagrams of embodiments of the insulation protection cover of the disclosure.
Figure 3B:
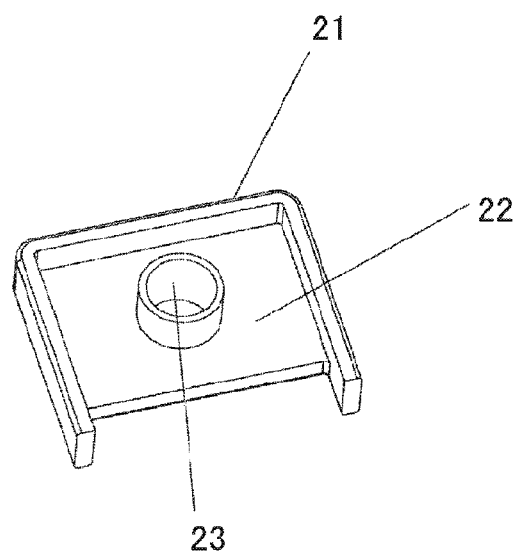

FIG. 3A and FIG. 3B illustrate the structure of an embodiment of the insulation protection cover of the disclosure. As shown in FIG. 3A and FIG. 3B, an insulation protection cover 2 comprises a body 20, the body comprises a second hole positioned at the center of the body, the second hole is extended toward the back surface 22 of the body 20 to form a hole column 23 having a second height. The body 20 further comprises a side belt, the side belt is extended toward the back surface 22 of the body 20 to form a sidewall 21 having a third height. The second height of the hole column 23 is larger than the third height of the sidewall 21. The sidewall 21 and the hole column 23 are both perpendicular to the body 20. The sidewall 21 is extended for a first length 210 with respect to the body 20. The body 20, sidewall 21 and hole column 23 are formed integrally. A material of said insulation protection cover 2 is a high temperature insulation material.

FIG. 6A and FIG. 6B illustrate the structure of a single semiconductor switch of the disclosure. As shown in FIG. 6A and FIG. 6B, the semiconductor switch 31 comprises a metal component 31a, an insulation component 31b and a pin 31c, the front surface A of the metal component 31a is installed on the back surface C of the insulation component 31b, and it is extended above the upper plane B of the insulation component 31b to form a metal portion 31a' having a first height, the metal portion 31a' comprises a first hole 310, a pin 31c, which is installed on the bottom plane D of the insulation component 31b.

FIG. 6C and FIG. 6D illustrate the structure of the insulation protection cover of the disclosure. FIG. 6E and FIG. 6F illustrate the installation schematic diagram of the insulation protection cover and the semiconductor switch in the semiconductor switch insulation protection device of the disclosure. By incorporating FIGS. 6A-6F, a groove is formed by the back surface of the body 20, the hole column 23 and the sidewall 21, and the metal portion 31a' having the first height is disposed in the groove. The front surface A of the metal component 31a in the semiconductor switch 31 is installed on the back surface C of the insulation component 31b. The insulation protection cover 2 is installed on the front surface A of the metal component 31a to allow that the metal portion 31a' having the first height is shielded entirely by said insulation protection cover. The third height of the sidewall 21 equals to the thickness of the metal component 31a, the second height of the hole column 23 is larger than the thickness of the metal component 31a (the thickness of the metal component 31a is the distance between its front surface A and its back surface E). The sidewall 21 is extended toward the direction of the pin for a first length 210, it is smaller than the distance between the upper plane B and the bottom plane D of the insulation component 31b. The insulation protection cover 2 and the semiconductor switch 31 are secured on a non-insulation object (for example, a heat sink) by a fastener (for example, a screw).

Figure 4:
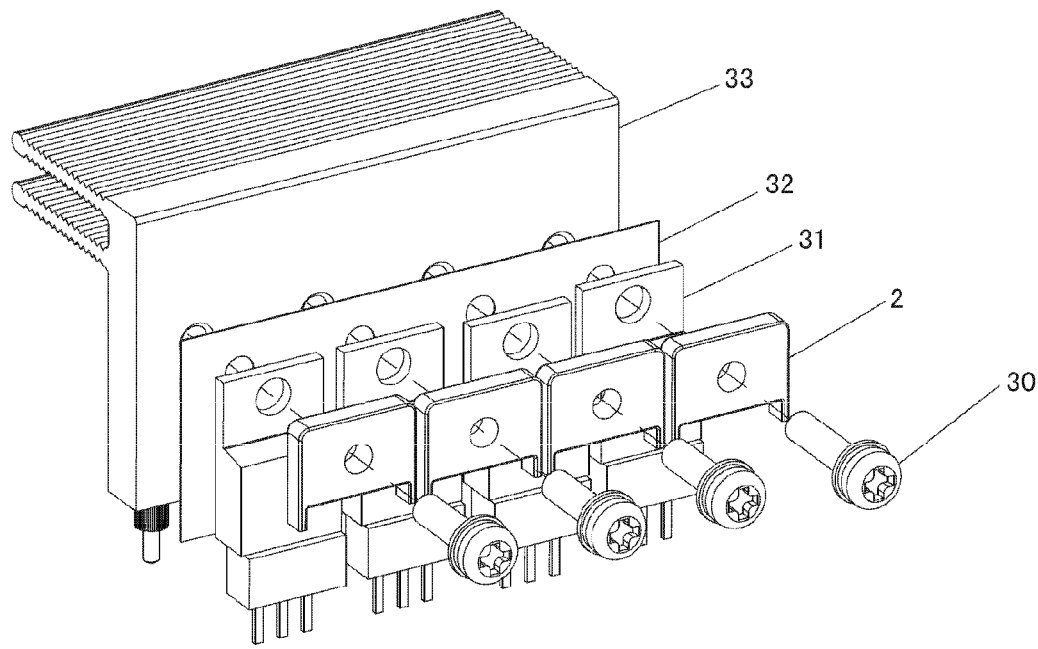
FIG. 4 and FIG. 5 illustrate partial assembly diagrams of a semiconductor switch insulation protection device installed in the power supply assembly of the disclosure.
Figure 5:
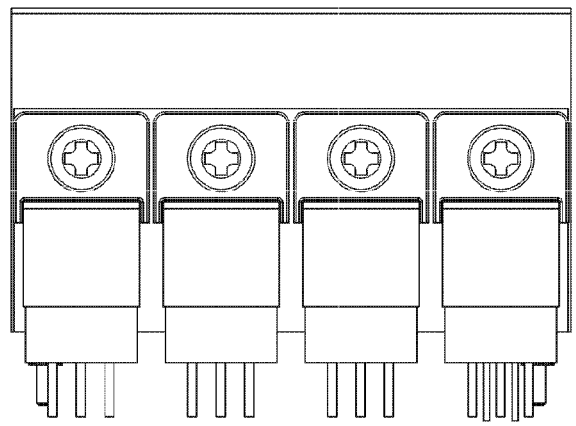

Furthermore, a power supply assembly is also disclosed in the disclosure, FIG. 4 illustrates a partial assembly structure, the power supply assembly comprises a heat sink device and an insulation protection device, wherein the heat sink device comprises a heat sink 33 and a thermal conduction insulation sheet 32, the semiconductor switch insulation protection device comprises a semiconductor switch 31 and an insulation protection cover 2, the semiconductor switch 31 and the insulation protection cover 2 are installed on the heat sink device by a fastener 30 (for example, a screw). The structure of the insulation protection cover 2 is shown as FIG. 3A and FIG. 3B, it comprises a body 20, the body comprises a second hole positioned at the center of the body, the second hole is extended toward the back surface of the body 20 to form a hole column 23 having a second height. The body 20 further comprises a side belt, the side belt is extended toward the back surface 22 of the body 20 to form a sidewall 21 having a third height. The second height of the hole column 23 is larger than the third height of the sidewall 21. The sidewall 21 and the hole column 23 are both perpendicular to the body 20. The sidewall 21 is extended for a first length 210 with respect to the body 20. The body 20, sidewall 21 and hole column 23 are formed integrally. A material of said insulation protection cover 2 is a high temperature insulation material.

FIG. 6A and FIG. 6B illustrate the structure of a single semiconductor switch of the disclosure, as shown in FIG. 6A, the semiconductor switch 31 (for example, a transistor), comprises a metal component 31a, an insulation component 31b, and a pin 31c, the metal component 31a comprises a first hole 310, the front surface A of the metal component 31a is installed on the back surface C of the insulation component 31b, and the back surface E of the metal component 31a is positioned to face the heat sink device, and it is extended above the upper plane B of the insulation component 31b to form a metal portion 31a' having a first height, the metal portion 31a' comprises a first hole 310, a pin 31c installed on the bottom plane D of the insulation component 31b.

FIG. 6C and FIG. 6D illustrate the structure of the insulation protection cover of the disclosure. FIG. 6E and FIG. 6F illustrate schematic diagram of the insulation protection cover, which is installed on a single semiconductor switch, of the disclosure. A groove is formed by the back surface of the body 20, the hole column 23 and the sidewall 21, the metal portion 31a' having the first height is disposed in the groove. The insulation protection cover is installed on the front surface A of the metal component 31a to allow that the metal portion 31a' having the first height is shielded entirely by the insulation protection cover 2. The third height of the sidewall 21 equals to the thickness of the metal component 31a, the second height of the hole column 23 is larger than the thickness of the metal component 31a (the thickness of the metal component 31a is the distance between its front surface A and its back surface E). The sidewall 21 is extended toward the direction of the pin for a first length 210, it is smaller than the distance between the upper plane B and the bottom plane D of the insulation component 31b. The insulation protection cover 2 and the semiconductor switch 31 are secured on a heat sink device by a fastener 30 (for example, a screw).

The above embodiments are provided to those skilled in the ordinary technology of the art to realize and use the disclosure, various modifications and changes of the above embodiments can be made by those skilled in the ordinary technology of the art without departing the inventive idea of the disclosure, therefore, the scope of the disclosure is not limited by the above embodiments, rather, the scope of the disclosure will be within the largest scope that conforms to the innovative features mentioned in the Claims.

What is claimed is:

1. A semiconductor switch insulation protection device, comprising a semiconductor switch, said semiconductor switch comprises a metal component, an insulation component, and a pin, a front surface of said metal component is installed on a back surface of said insulation component, and a metal portion having a first height is extended above an upper plane of said insulation component, said metal portion comprises a first hole, said pin is installed at a bottom plane of said insulation component, wherein the semiconductor switch insulation protection device further comprises an insulation protection cover, said insulation protection cover comprises a body, said body comprises a second hole and a side belt, said second hole is extended toward a back surface of said body to form a hole column having a second height, said side belt is extended toward the back surface of said body to form a sidewall having a third height, a groove is formed by the back surface of said body, said hole column and said sidewall, and the metal portion having the first height is disposed in said groove, wherein said second height of said hole column is larger than a thickness of said metal component.

2. The semiconductor switch insulation protection device as claim 1, wherein said insulation protection cover is installed on the front surface of said metal component to allow that said metal portion having the first height is shielded entirely by said insulation protection cover.

3. The semiconductor switch insulation protection device as claim 1, wherein the third height of said sidewall equals to the thickness of said metal component.

4. The semiconductor switch insulation protection device as claim 1, wherein said sidewall is extended toward a direction of said pin for a first length.

5. The semiconductor switch insulation protection device as claim 4, wherein said first length is smaller than a distance between the upper plane and bottom plane of said insulation component.

6. The semiconductor switch insulation protection device as claim 1, wherein said sidewall and said hole column are both perpendicular to said body.

7. The semiconductor switch insulation protection device as claim 1, wherein a material of said insulation protection cover is a high temperature insulation material.

8. The semiconductor switch insulation protection device as claim 1, wherein the body, the hole column, and the sidewall of said insulation protection cover are formed integrally.

9. The semiconductor switch insulation protection device as claim 1, wherein said insulation protection cover and said semiconductor switch are secured on a non-insulation object by said fastener.

10. A power supply assembly, comprising a heat sink device, a semiconductor switch, said semiconductor switch comprises a metal component, an insulation component, and a pin, a front surface of said metal component is installed on a back surface of said insulation component, and said metal component is extended above an upper plane of said insulation component to form a metal portion having a first height, said metal portion comprises a first hole, said pin is installed on a bottom plane of said insulation component, wherein the power supply assembly further comprises an insulation protection cover, said insulation protection cover comprises a body, said body comprises a second hole and a side belt, said second hole is extended toward a back surface of said body to form a hole column having a second height, said side belt is extended toward the back surface of said body to form a sidewall having a third height, a groove is formed by the back surface of said body, said hole column and said sidewall, and the metal portion having the first height is disposed in said groove, said insulation protection cover and said semiconductor switch are installed on said heat sink device by a fastener, wherein said second height of said hole column is larger than a thickness of said metal component.

11. The power supply assembly as claim 10, wherein said insulation protection cover is installed on the front surface of said metal component to allow that said metal portion having the first height is shielded entirely by said insulation protection cover.

12. The power supply assembly as claim 10, wherein a back surface of said metal component is disposed to face said heat sink device.

13. The power supply assembly as claim 10, wherein the third height of said sidewall equals to the thickness of said metal component.

14. The power supply assembly as claim 10, wherein said sidewall is extended toward a direction of the pin for a first length.

15. The power supply assembly as claim 14, wherein said first length is smaller than a distance between the upper plane and the bottom plane of said insulation component.

16. The power supply assembly as claim 10, wherein said sidewall and said hole column are both perpendicular to said body.

17. The power supply assembly as claim 10, wherein a material of said insulation protection cover is a high temperature insulation material.

\* \* \* \* \*